United States Patent [19]
Sato et al.

[11] Patent Number: 5,458,753
[45] Date of Patent: Oct. 17, 1995

[54] TRANSPARENT CONDUCTIVE FILM CONSISTING OF ZINC OXIDE AND GALLIUM

[75] Inventors: Kazuo Sato; Akira Mitsui; Kunihiko Adachi, all of Yokohama, Japan

[73] Assignee: Asahi Glass Company, Ltd., Tokyo, Japan

[21] Appl. No.: 80,522

[22] Filed: Jun. 24, 1993

[30] Foreign Application Priority Data

| Jul. 13, 1992 | [JP] | Japan | 4-207470 |
| Sep. 11, 1992 | [JP] | Japan | 4-269561 |
| Feb. 26, 1993 | [JP] | Japan | 5-062863 |

[51] Int. Cl.$^6$ ............. C23C 14/00; C23C 14/32; C09D 1/00
[52] U.S. Cl. ............. 204/192.29; 106/286.2; 106/286.8; 204/192.1
[58] Field of Search ............. 136/262, 265; 106/286.1, 286.8, 286.2; 252/512, 518; 428/457, 544, 546, 632, 642, 658, 689, 913; 204/192.1, 192.17, 192.21, 192.29

[56] References Cited

U.S. PATENT DOCUMENTS

| 4,638,111 | 1/1987 | Gay | 136/249 |
| 4,751,149 | 6/1988 | Vijayakumar et al. | 428/702 |
| 4,939,043 | 7/1990 | Biricik et al. | 428/620 |
| 5,078,803 | 1/1992 | Pier et al. | 136/256 |
| 5,091,765 | 2/1992 | Yoshinaka et al. | 357/30 |
| 5,236,632 | 8/1993 | Ogawa et al. | 252/518 |

FOREIGN PATENT DOCUMENTS

| 0351004 | 1/1990 | European Pat. Off. |
| 0412810 | 2/1991 | European Pat. Off. |
| 0464789 | 1/1992 | European Pat. Off. |
| 0486182 | 5/1992 | European Pat. Off. |
| 372011 | 11/1991 | Japan |

OTHER PUBLICATIONS

Group III Impurity Doped Zinc Oxide Thin Films Prepared by RF Magnetron Sputtering, Tadatsugu Minami, et al, *Jpn. J. Appl. Phys.*, vol. 24 (1985), No. 10, pp. L781–L784.
Journal of Applied Physics, vol. 55, No. 4, Feb. 15, 1984, pp. 1029–1034, Nanto, et al., "Electrical And Optical Properties Of Zinc Oxide Thin Films Prepared By RF Magnetron Sputtering For Transparent Electrode Applications".

*Primary Examiner*—Paul J. Thibodeau
*Assistant Examiner*—Stephen Sand
*Attorney, Agent, or Firm*—Oblon, Spivak, McClelland, Maier & Neustadt

[57] ABSTRACT

A transparent conductive film comprising zinc oxide as the main component, which contains gallium in an amount of from 0.5 to 12 atomic % based on the total amount of gallium and zinc, and which has a diffraction peak of the (002) face in its X-ray diffraction pattern, wherein the half value width of the diffraction peak of the (002) face is at most 0.6 degree.

1 Claim, 3 Drawing Sheets

X-ray diffraction angle (degree)

X-ray diffraction angle (degree)

TRANSPARENT CONDUCTIVE FILM CONSISTING OF ZINC OXIDE AND GALLIUM

FIELD OF THE INVENTION

The present invention relates to a transparent conductive film which exhibits high performance. More particularly, it relates to a transparent conductive film useful as a transparent electrode for a display device such as a liquid display device or a plasma luminescence device, or a transparent electrode for a solar cell, or as a heat-ray reflecting film or a transparent heater element. Further, the present invention relates to a target for sputtering and a material for vapor deposition to be used for forming a transparent conductive film.

DESCRIPTION OF THE PRIOR ART

Transparent conductive films have both high electrical conductivity and high transmittance in a visual light range, and they are used as transparent electrodes for display devices such as liquid crystal display devices, plasma luminescence devices or EL (electro luminescence) devices, or as transparent electrodes for solar cells, TFT and other various photo receptor devices. Further, they are widely used as heat-ray reflecting films for automobiles and buildings, as antistatic films for photomasks and other various applications, or as transparent heater elements for various anti-fogging equipment including freezer show cases. Furthermore, they are useful as substrates for electrochromic devices such as light controlling glass.

Heretofore, as a transparent conductive film, tin oxide ($SnO_2$) containing antimony or fluorine as a dopant, or indium oxide ($In_2O_3$) containing tin as a dopant, or zinc oxide deposited on a glass substrate, is known. Especially an indium oxide film having tin incorporated therein (hereinafter referred to as an ITO film) is widely used mainly as an electrode for a display device such as a liquid crystal device, since a low resistance film can thereby be readily obtained.

At present, a common method for forming an ITO film on a glass substrate is a vacuum deposition method or a sputtering method. However, in either method, so long as the starting material is indium, there is a limit in reducing the cost of the substrate, since indium is a rare metal and expensive. Further, the amount of indium deposits is particularly small as compared with other elements. Indium is extracted as a by-product during refining of a zinc ore, and its production is dependent on the production of zinc, whereby it is difficult to significantly increase the amount of production. If the demand for transparent conductive films increases as the market size for display devices or the like further expands in future, there will be a problem in the constant supply of indium as a starting material in the case of ITO.

On the other hand, a transparent conductive film composed mainly of zinc oxide (ZnO) has an advantage such that it is very inexpensive, since zinc is the main starting material, and there is no problem with respect to the resource and the constant supply, since both the zinc deposits and the zinc production are substantial. Further, with respect to a specific resistance, it is known that a low resistance film comparable to ITO with a resistance at a level of $10^{-4}$ $\Omega \cdot cm$ can be obtained by incorporating impurities such as Al. Therefore, a ZnO film is expected as an inexpensive conductive film to be substituted for the ITO film.

However, in the case of an Al-incorporated film (an AZO film), in order to obtain a low resistance film at a level of $10^{-4}$ $\Omega \cdot cm$ on a glass substrate by a sputtering method as the most common method for forming a ZnO film, it has been required to adopt a special arrangement of the substrate such that the substrate must be arranged perpendicular to the target, or it has been required to employ a special measure such as application of an external magnetic field, as reported, for example, in "Thin Solid Films", 124, 43 (1985).

Further, to reduce the resistance, heat treatment in a non-oxidizing atmosphere after the film formation has been required. Moreover, it has been difficult to produce a low resistance film with good reproducibility, since the influence of the change with time of the target is substantial. The film-forming rate of such a low resistance film is as low as not more than about 5 Å/sec. Therefore, in the practical industrial production, it has been a fatal problem that the production rate is low, which reduces the overall effects for reduction of the costs. Thus, the feature of ZnO that the cost for the starting material is low, has not effectively been utilized.

When an ITO film or an AZO film is formed by a vacuum deposition method, it is common to employ a pellet or chunk made of an oxide such as an ITO type or an AZO type, as the evaporation material for such reasons that a low resistance thin film can readily be formed, or the control during the film formation is easy.

However, for example, in the case of the ITO type, the evaporation rates of In and Sn differ from each other, and there has been a problem that the composition of the formed film changes and the specific resistance of the film increases as the vapor deposition time passes. Also in the case of the AZO type, the evaporation rates of Al and Zn differ from each other, whereby there has been the same problem as in the case of the ITO type.

Further, with the conventional evaporation material of the ITO type or the AZO type, the composition of the evaporation material itself naturally changes, and it can not be used for a long period of time. Thus, there has been a problem from the viewpoint of the effective use of the evaporation material, since most of it is not used. Therefore, an evaporation material having little change with time in the film composition and in the evaporation material, has been desired.

On the other hand, when a transparent conductive film is applied to an electrode for e.g. a display device, it will be exposed to heat treatment at a high temperature at a level of from 300° to 500° C. in the process for the preparation of the device. The heat treatment may be conducted in an inert gas, but in such a case, an installation to maintain the inert gas atmosphere is required, which adds to the cost. Therefore, for a practical industrial operation, heat treatment in the atmospheric air is required. Further, when a transparent conductive film is used as a heater element, it will be used in such a state that it is heated under application of an electric current in the atmospheric air. Therefore, it is required that the change in resistance due to heat generation is little, i.e. it is required to have heat resistance in an oxidizing atmosphere. Also when a transparent conductive film is applied to a heat-ray reflecting glass, it will be subjected to high temperature heat treatment at a level of at least 600° C. in the atmospheric air for the bending treatment or reinforcing treatment. Therefore, it is likewise required to have heat resistance. Thus, when a transparent conductive film is applied to an industrial field, it is required to have not only heat resistance in a non-oxidizing atmosphere but also high heat resistance in the atmospheric air.

In this respect, the ITO film has certain heat resistance in the atmospheric air, although the heat resistance may not be adequate. Therefore, ITO is used mainly for e.g. liquid crystal display devices, since the heat resistance required here is only at a relatively low level at a temperature of about 300° C. Whereas, a conventional ZnO film (containing no additive) is very poor in the heat resistance in an oxidizing atmosphere as compared with ITO, and it has been a problem to be solved for practical application to improve the heat resistance in an oxidizing atmosphere.

In order to improve the heat resistance of such a ZnO film, it has been proposed to add impurities of Group 3 in the periodic table to ZnO, as disclosed in Japanese Examined Patent Publication No 72011/1991, whereby the heat resistance in a non-oxidizing atmosphere such as in an argon stream or under vacuum, can be improved. However, it is also known that even if impurities of Group 3 are incorporated, the electrical resistance may increase more than ten thousands times by a high temperature heat treatment at 400° C. in the atmospheric air, and it will be practically useless as a conductive film (Technology Report of Denshi Tsushin Gakkai, CPM84- 8, 55 (1984)), although the heat resistance in an inert gas atmosphere or in a reducing gas atmosphere may be improved. Because of this lack in the heat resistance in the atmospheric air, the practical application of the ZnO film as a transparent conductive film is delayed.

Thus, when a transparent conductive film is to be applied to a substrate of a display device, a transparent heater element or a heat-ray reflecting glass, it is very important that the film has a characteristic that the electrical and optical properties thereof will not be lost, since the transparent conductive film will be subjected to high temperature heating in the atmospheric air. However, a transparent conductive film composed essentially of ZnO, while being expected as an inexpensive material to be substituted for ITO, has been delayed in its industrial or practical application in a wide range, since its heat resistance in an oxidizing atmosphere is inadequate, and improvement of the heat resistance in the atmospheric air has been the most important objective for the ZnO film.

SUMMARY OF THE INVENTION

It is an object of the present invention to solve the above-mentioned drawbacks of the prior art and to provide a transparent conductive film having low resistance and high transmittance even when produced at a high speed, particularly a high quality and inexpensive transparent conductive film having a characteristic such that it does not lose electrical properties even when subjected to high temperature heat treatment in an oxidizing atmosphere such as in atmospheric air, more particularly a transparent conductive film industrially useful as an electrode for display devices, as a transparent heater element for automobiles or buildings, and as a heat-ray reflecting glass.

Another object of the present invention is to provide a sputtering target and an evaporation material for vacuum deposition, which is capable of constantly forming a transparent conductive film having low resistance and high heat resistance even in the atmospheric air and which brings about little change in the film composition or in the starting material during the formation of a transparent conductive film or during the vapor deposition.

Namely, to form a transparent conductive film, the film-forming is conducted by using a sputtering target characterized in that the Ga solid-solubilized ZnO phase is present in a proportion of at least a certain predetermined level than the ZnO phase, in a zinc oxide sintered target containing gallium as a dopant, whereby a transparent conductive film having high heat resistance can be formed constantly even in an atmosphere containing oxygen, such as in air.

The present invention has been made to solve the above-mentioned problems and provides a transparent conductive film comprising zinc oxide as the main component, which contains gallium in an amount of from 0.5 to 12 atomic % based on the total amount of gallium and zinc and which has a diffraction peak of the (002) face in its X-ray diffraction pattern, wherein the half value width of the diffraction peak of the (002) face is at most 0.6 degree, i.e. a transparent conductive film excellent in the heat resistance in the atmospheric air and having the conductivity improved to a large extent over the conventional films.

DETAILED DESCRIPTION OF THE INVENTION

Figure 1:
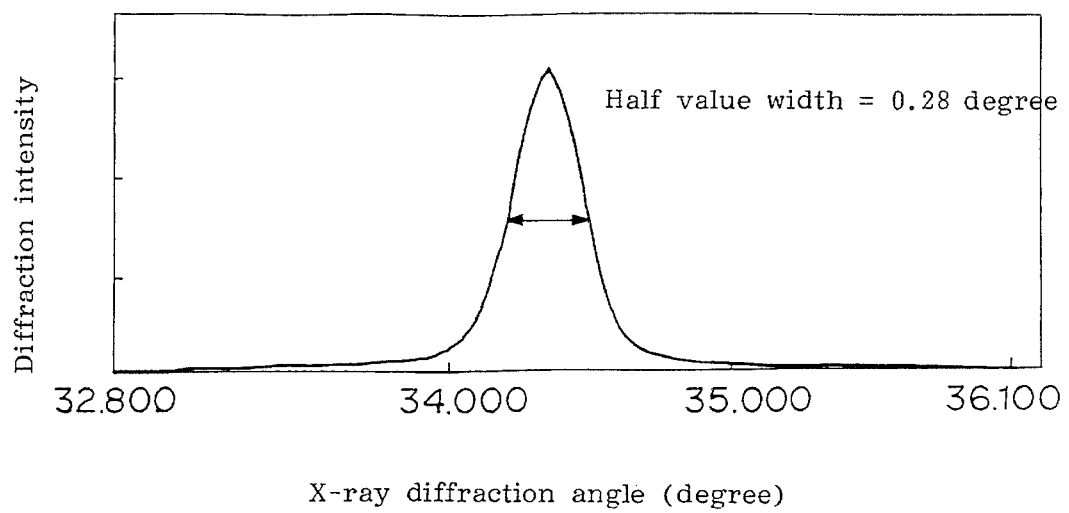
FIG. 1 is a graph showing the half value width of the X-ray diffraction peak of the (002) face of the transparent conductive film of Example 3.

The transparent conductive film (hereinafter sometimes referred to simply as the conductive film) of the present invention may contain metal elements other than Zn and Ga, so long as they do not impair the object of the present invention. However, their amounts should be as small as possible.

Glass or plastics may be used for the substrate useful for forming the transparent conductive film of the present invention. In a case where the substrate contains an alkali metal as its component, like soda lime glass, it is preferred to form an under layer composed essentially of an oxide of a metal such as Si, Al or Zr between the substrate and the conductive film to prevent diffusion of the alkali metal from the substrate to the conductive film during the film-forming operation, during the heat treatment or during the use for a long period of time.

The method for forming the conductive film of the present invention is not particularly limited, and a physical vapor deposition method such as a sputtering method or a vacuum deposition method, or a chemical deposition method such as a CVD method may be employed. Particularly preferred is a physical vapor deposition method whereby good conductive film properties can be obtained at a lower level of the substrate temperature. Among them, particularly preferred is a sputtering method in which a high density plasma effective for promoting the crystallization is employed as an activating means, a low voltage sputtering method employing a high magnetic field, or a plasma activated vacuum deposition method whereby a low resistance film excellent in the heat resistance can be obtained. In the Examples, the sputtering method is conducted by a direct current method, but it can, of course, be conducted by a high frequency method.

When the conductive film of the present invention is prepared by using e.g. a magnetron direct current sputtering method, the low electrical resistance and the high heat resistance in the atmospheric air can be secured even when formed into a film at a high speed of up to 40 Å/sec. Thus, it has an advantage that the film can be grown at a practical film-forming speed.

Further, the present invention provides a sputtering target made of a sintered body of zinc oxide containing gallium, wherein the ratio of integrated intensity $I_1$ of the X-ray diffraction peak of the (002) face of Ga solid-solubilized ZnO phase shifted towards a high angle side by the solid solubilization of gallium, to integrated intensity $I_2$ of the X-ray diffraction peak of the (002) face of a ZnO phase at a low angle side having no Ga solid-solubilized, is at least 0.2 (i.e. $I_1/I_2 \geq 0.2$).

The target of the present invention consists essentially of oxides of zinc and gallium and contains gallium in an amount of from 0.5 to 12 atomic %. Here, calculation was made by the formula:

Ga atomic %=Ga/(Ga+Zn)×100.

The target of the present invention may further contain other components to an extent not to impair the purpose and effects of the present invention. However, their amounts should be as small as possible.

Figure 3:
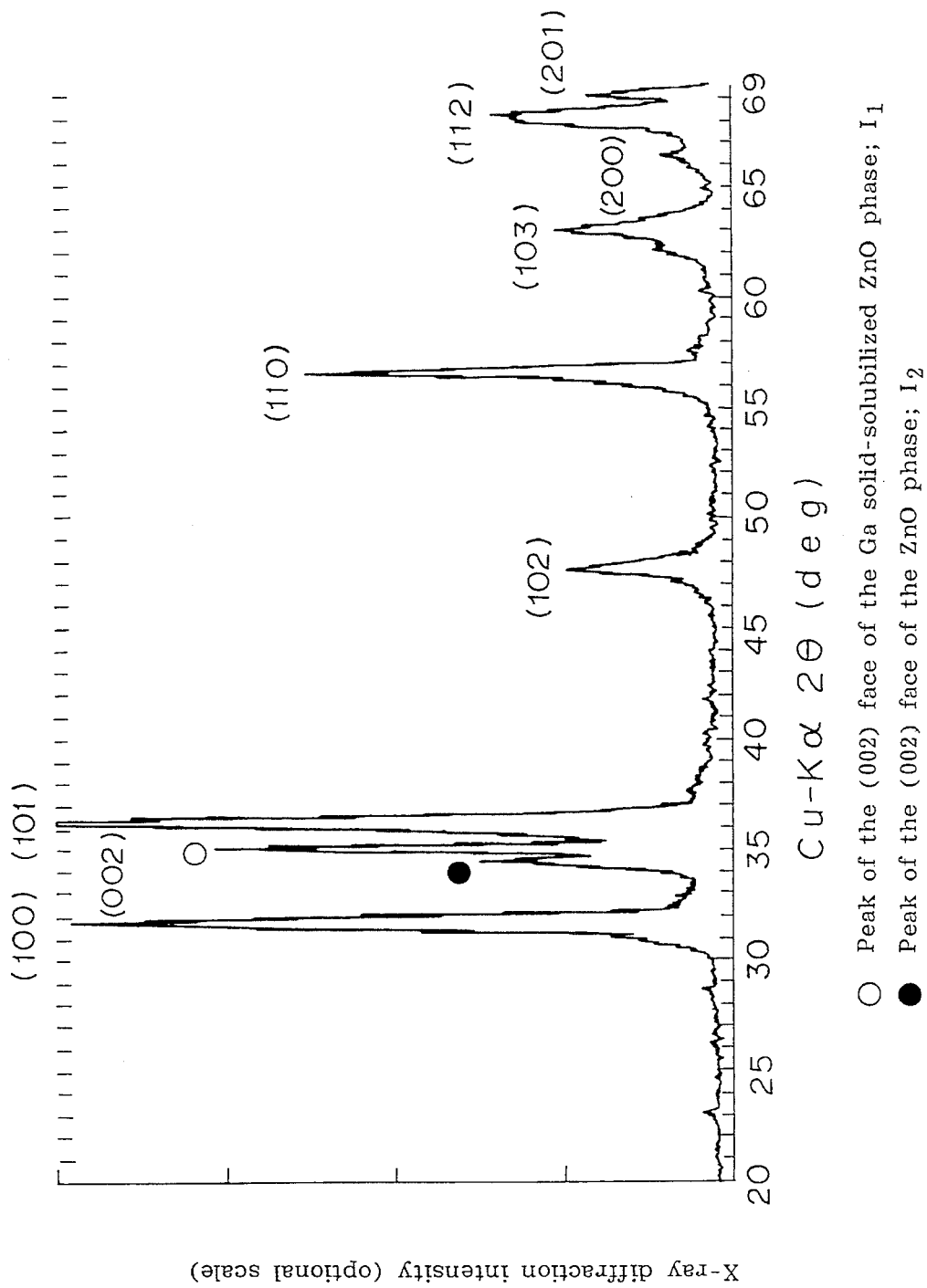
FIG. 3 is a graph showing a typical X-ray diffraction pattern of the sputtering target of the present invention.

FIG. 3 is a graph showing the X-ray diffraction pattern of the target of the present invention. The abscissa represents the diffraction angle 2θ(deg) by Cu-Kα ray, and the ordinate represents the intensity.

From the X-ray diffraction pattern, it is considered that the Ga solid-solubilized ZnO phase is a substitution type regular solid-solution having Ga atoms substituted for certain specific Zn atoms of the ZnO crystal, and it is a crystal like a ZnO crystal contracted in the C-axial direction. This is supported also from the fact that the smaller the $Ga_2O_3$ content, the smaller the integrated intensity of the peak corresponding to the Ga solid-solubilized ZnO phase. In the present invention, attention has been drawn to the (002) face which most distinctly represents the above described crystal state, and the optimum proportion of the Ga solid-solubilized ZnO phase has been found out by the ratio of the integrated intensity of the X-ray diffraction peak of the (002) face shifted towards a high angle side (i.e. contracted in the C-axial direction by the solid solubilization of Ga (○ in FIG. 3: $I_1$) to the integrated intensity of the X-ray diffraction peak of the (002) face not shifted i.e. without solid solubilization of Ga, or containing little amount of solid-solubilized Ga (● in FIG. 3: $I_2$). The integrated intensity in the present invention is calculated by a peak area obtained by subtracting the background from each peak.

In the present invention, it is preferred that the ratio of integrated intensity $I_1$ of the X-ray diffraction peak of the (002) face of the Ga solid-solubilized ZnO phase to integrated intensity $I_2$ of the X-ray diffraction peak of the (002) face of the ZnO phase at a low angle side wherein no gallium is solid-solubilized, is at least 0.2 ($I_1/I_2 \geq 0.2$). If this ratio of intensity $I_1/I_2$ is lower than 0.2, i.e. if a film is formed by using a target containing a little amount of the Ga solid-solubilized ZnO phase and a substantial amount of the ZnO phase containing no solid-solubilized gallium, the crystallinity of the film will be inadequate, and high heat resistance can not be obtained. In the present invention, it is particularly preferred that the ratio of intensity $I_1/I_2$ is at least 1.0, since it is thereby possible to obtain a film having higher crystallinity or a film having higher heat resistance.

The target (a sintered body) wherein the ratio of integrated intensity $I_1$ of the X-ray diffraction peak of the (002) face of the Ga solid-solubilized ZnO phase to integrated intensity $I_2$ of the X-ray diffraction peak of the (002) face of the ZnO phase at a low angle side wherein no gallium is solid-solubilized, is at least 0.2 ($I_1/I_2 \geq 0.2$), can be prepared, for example, as follows.

Namely, ZnO powder and $Ga_2O_3$ powder both having an average particle size of at most 1 μm are weighed in predetermined amounts and mixed in acetone for at least 3 hours by means of a ball mill to obtain a powder as the starting material for a sintered body. This powder is molded by a rubber press method, and the molded product is sintered at a temperature of from 1400° to 1600° C. for 2 hours to obtain e.g. a target (a sintered body) of the present invention. To obtain a dense target, the sintering temperature is preferably from 1400° to 1550° C. If the sintering temperature is lower than 1400° C., the porosity tends to be high, whereby a plasma during the film-forming operation (sputtering) tends to be unstable, such being undesirable. On the other hand, if the sintering temperature is higher than 1550° C., evaporation during the sintering tends to be so vigorous that the composition will be changed, whereby it tends to be difficult to obtain a target having a desired composition.

As an alternative method, it is possible to obtain a target by hot-pressing the starting powder at a temperature of from 1000° to 1200° C. to obtain a sintered body and then heat-treating the sintered body in air at a temperature of from 1200° to 1600° C.

The present invention further provides a material for vacuum deposition consisting essentially of a sintered body of zinc oxide containing gallium, wherein the sintered body of zinc oxide has a ratio of integrated intensity $I_1$ of the X-ray diffraction peak of the (002) face of a Ga solid-solubilized ZnO phase shifted towards a high angle side by the solid solubilization of gallium, to integrated intensity $I_2$ of the X-ray diffraction peak of the (002) face of a ZnO phase at a low angle side having no Ga solid-solubilized, being at least 0.2 (i.e. $I_1/I_2 \geq 0.2$).

The material for vacuum deposition of the present invention consists essentially of oxides of zinc and gallium and contains gallium in an amount of from 0.5 to 12 atomic %. Here, calculation was made in accordance with the following formula:

*Ga atomic %=Ga/(Ga+Zn)×100.*

The material for vacuum deposition of the present invention may further contain other components to such an extent that they do not impair the purpose and effects of the present invention, but their amounts should be as small as possible.

Figure 4:
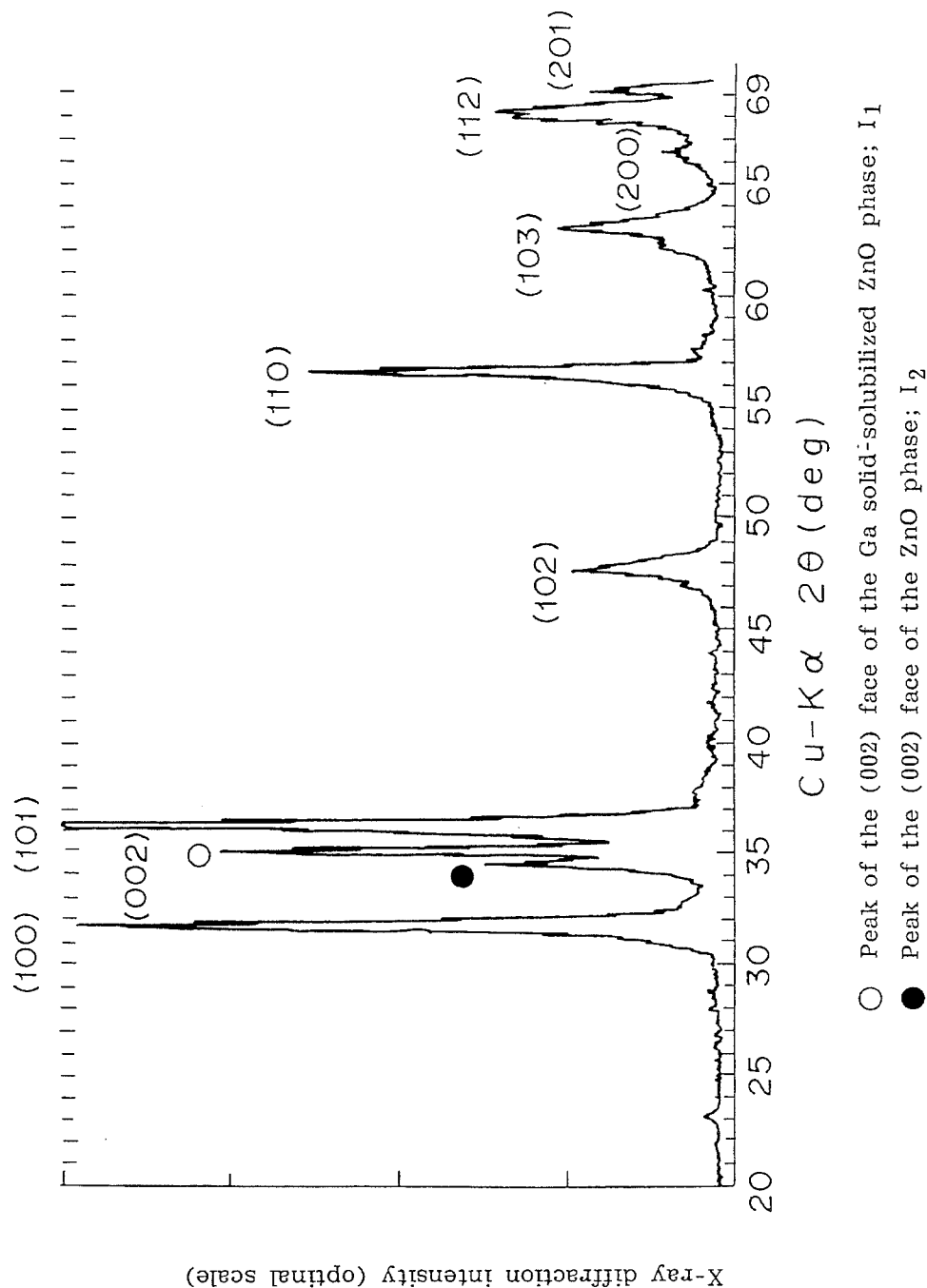
FIG. 4 is a graph showing a typical X-ray diffraction pattern of the material for vacuum deposition of the present invention.

FIG. 4 is a graph showing the X-ray diffraction pattern of the material for vacuum deposition of the present invention. The abscissa represents the diffraction angle 2θ(deg) by a Cu-Kα ray, and the ordinate represents the intensity.

From the X-ray diffraction pattern, it is considered that the Ga solid-solubilized ZnO phase is a substitution type regular solid solution having Ga atoms substituted for certain specific Zn atoms of the ZnO crystal and is a crystal like a ZnO crystal contracted in the c-axial direction. This is supported also by the fact that the smaller the amount of $Ga_2O_3$, the smaller the integrated intensity of the peak corresponding to the Ga solid-solubilized ZnO phase.

In the present invention, attention has been drawn to the (002) face which most distinctly represents the above-described crystal state as in the case of the target, and the optimum proportion of the Ga solid-solubilized ZnO phase has been found out by the ratio of the integrated intensity of the X-ray diffraction peak of the (002) face shifted towards a high angle side i.e. contracted in the c-axial direction by the solid solubilization of Ga (○ in FIG. 1: $I_1$) to the integrated intensity of the X-ray diffraction peak of the (002) face not shifted i.e. containing no solid-solubilized Ga, or containing little amount of solid-solubilized Ga (● in FIG. 1: $I_2$). The integrated intensity in the present invention is calculated by a peak area obtained by subtracting the background from each peak.

In the present invention, it is preferred that the ratio of integrated intensity $I_1$ of the X-ray diffraction peak of the (002) face of the Ga solid-solubilized ZnO phase to integrated intensity $I_2$ of the X-ray diffraction peak of the (002) face of the ZnO phase at a low angle side wherein no gallium is solid-solubilized, is at least 0.2 ($I_1/I_2 \geq 0.2$). If this ratio of intensity $I_1/I_2$ is lower than 0.2, i.e. if a film is formed by using a material for vacuum deposition containing a small amount of the Ga solid-solubilized ZnO phase and a substantial amount of the ZnO phase containing no solid-solubilized gallium, evaporation rates of Ga and Zn differ from each other, whereby it will be difficult to obtain a material for vacuum deposition having little change with time. In the present invention, it is particularly preferred that the ratio of intensity $I_1/I_2$ is at least 1.0, since it is thereby possible to obtain a material for vapor deposition having little change with time.

The material for vapor deposition (a sintered body) wherein the ratio of integrated intensity $I_1$ of the X-ray diffraction peak of the (002) face of the Ga solid-solubilized ZnO phase to integrated intensity $I_2$ of the X-ray diffraction peak of the (002) face of the ZnO phase at a low angle side wherein no gallium is solid-solubilized, is at least 0.2 ($I_1/I_2 \geq 0.2$), can be prepared, for example, as follows.

Namely, ZnO powder and $Ga_2O_3$ powder both having an average particle size of at most 1 μm are weighed in predetermined amounts and mixed in acetone for at least 3 hours by means of a ball mill to obtain a powder as the starting material for a sintered body. This powder is molded by a rubber press method, and the molded product is sintered in air at a temperature of from 1350 to 600° C., preferably from 1350° to 1550° C., for 2 hours to obtain e.g. a material for vapor deposition (a sintered body) of the present invention.

For example, to obtain a material for vapor deposition having good electrical conductivity which is suitable for an electron beam vapor deposition (EB vapor deposition) and which is hardly charged up, the sintering temperature is preferably from 1350° to 1550° C. If the sintering temperature is lower than 1350° C., the resistance of the sintered body tends to be high, and the electron beam tends to be unstable during the vapor deposition, such being undesirable. Further, if the sintering temperature is higher than 1550° C., evaporation during the sintering tends to be so vigorous that the composition will be changed, whereby it will be difficult to obtain a material having the desired composition. For the purpose of further increasing the electrical conductivity of the material for vapor deposition, the material for vapor deposition (sintered body) may be heat-treated in a non-oxidizing (reducing) atmosphere such as in an argon atmosphere or in vacuum.

The present inventors have found that by controlling the Ga concentration in the ZnO transparent conductive film to a level of from 0.5 to 12% by atomic ratio and by controlling the crystallinity of the film so that the half value width of the X-ray diffraction peak of the (002) face of the film will be at most 0.6 degree, a film having a specific resistance of $2 \times 10^{-4}$ Ω·cm, i.e. as low as that of ITO, can readily be obtained even when produced at a high speed with a usual arrangement of the substrate. Further, it has been found that such a film shows no deterioration in the electrical conductivity after heat treatment in the atmospheric air at a temperature of 500° C. or higher and thus is excellent in the heat resistance in an oxidizing atmosphere.

It has already been reported to merely incorporate Ga to ZnO (J. Electrochem. Soc., 127, 1636 (1980), and Jpn. J. Appln. Phys., 24, L781 (1985)). The former discloses a case wherein 1 atomic % of Ga was incorporated to Zn, and the latter discloses a case of a sputtering method in which from 1 to 4 atomic % of Ga was incorporated to Zn. However, in each case, the report is directed to a comparative study between the incorporated film and the non-incorporated film with respect to the electrical and optical properties, and no study or disclosure is given with respect to the heat resistance. Further, the electrical conductivity of such films was inferior to a conventional Al-incorporated film.

Whereas, the present invention makes it possible to remarkably improve the heat resistance in the atmospheric air and to improve the electrical properties to a large extent by controlling the amount of Ga incorporated and the crystallinity of the film. Namely, it has been found that such heat resistance will not be attained simply by incorporating Ga and can be attained only when Ga is incorporated in an amount within a certain specific range and the half value width of the X-ray diffraction is adjusted to be at a level not higher than a certain specific value.

It is generally known that when a metal of Group 3 of the periodic table is incorporated to ZnO, the electron density increases and the electrical conductivity increases. This is considered to be attributable to the fact that the metal of Group 3 i.e. the trivalent metal is substituted at the position of the bivalent Zn to form a shallow electrical donor to produce a free electron. Further, the increase of the electron density by the formation of a donor may also be explained by the simultaneous formation of excess Zn at lattice spaces or the formation of oxygen deficit. In the actual film, such states are believed to be present in a mixed state. The ion radius of Group 3 element and that of Zn are not the same, and in the substituted case, a strain is likely to be created in the crystal lattice.

Further, all of the Group 3 element is not substituted, and it is believed that a part thereof is precipitated at the crystal lattice spaces or at the grain boundaries, because the amount of the Group 3 element detected in the film is greater by about one figure than the amount theoretically calculated from the electron density. Such an excess element causes a lattice strain, which, in turn, is expected to cause formation of oxygen vacancies or the like. Defects such as oxygen vacancies will decrease when heat-treated under a high temperature oxygen atmosphere, and it is considered that the electron density attributable to such vacancies will also decrease, whereby the electrical resistance will increase.

In fact, with a ZnO film having a Group 3 element such as Al, In or B other than Ga incorporated, the heat resistance in an oxidizing atmosphere such as in the atmospheric air is very poor although the heat resistance in a non-oxidizing atmosphere is good. The present inventors have investigated, by the X-ray diffraction, the relation between the composition and crystallinity of the film and the heat stability in the atmospheric air, and as a result, have found it possible to obtain a film excellent in the heat resistance in the atmospheric air only when the additional element is Ga i.e. not merely a Group 3 element and its amount is within a certain specific range, and the half value width of the X-ray diffraction of the film is lower than a specific value.

As a factor for the difference in the heat resistance in the atmospheric air as between a case where the additional element is Al, B or In and a case where the additional element is Ga, the difference in the ion radius may be mentioned. Namely, the ion radii of Al and B are, respectively, too small as compared with the ion radius of Zn. On the other hand, the ion radius of In is too large. It is considered that since the ion radius of Ga is closest to that of Zn, the lattice strain when substituted will be smallest. In order to obtain a low resistance film, it is necessary to add a large amount of Al, B or In. It is considered that in such a case, the strain will increase, whereby oxygen voids will be formed. Such defects will readily be reduced by high temperature heat treatment in an oxidizing atmosphere, and free electrons formed by the defects will simultaneously decrease, and the resistance will increase.

Whereas, in the case of a Ga-incorporated film, it is believed that such a lattice strain or oxygen defects scarcely form even by the incorporation of a large amount of Ga, whereby the heat resistance in the oxidizing atmosphere will be improved. It has been found that also in the case of incorporation of Ga, the heat resistance depends largely on the crystallinity of the film, and the heat resistance in the oxidizing atmosphere will be remarkably improved in a case of a film having good crystallinity i.e. in a case where the half value width of the X-ray diffraction peak is lower than a certain level.

It is believed that in the present invention, gallium in the target or in the starting material for vapor deposition is present in the form of a Ga solid-solubilized ZnO phase, whereby uniform evaporation of Ga atoms and Zn atoms is facilitated, the changes with time in the film composition and the starting material will be little during the film-forming operation, and substitution of Ga atoms to the positions of Zn atoms in the formed film will be facilitated, and it is thereby possible to minimize Ga atoms present between atoms, and accordingly, a film having very high crystallinity can be formed, and a low resistance transparent conductive film having high heat resistance can be obtained even in an atmosphere containing oxygen, such as in the atmospheric air.

DESCRIPTION OF THE PREFERRED EMBODIMENTS

Now, the present invention will be described in further detail with reference to Examples. However, it should be understood that the present invention is by no means restricted to such specific Examples.

EXAMPLES 1 to 6 and COMPARATIVE EXAMPLES 1 to 9

Now, the Examples of the present invention will be described in detail with reference to the drawings and the Tables. Glass substrates (5 cm×5 cm×1 mm) each having a silica film having a film thickness of about 50 nm formed as an alkali barrier coat, were prepared and thoroughly washed. On such silica-coated glass substrates, ZnO transparent conductive films having film thicknesses of from 300 to 1000 nm were formed in an Ar atmosphere by means of various targets having gallium oxide ($Ga_2O_3$) added to ZnO (the Ga/Ga+Zn ratio being from 0.3 to 15 atomic %) by a direct current sputtering method.

The vacuum apparatus was preliminarily evacuated to a level of at most $10^{-6}$ Torr. Then, sputtering was conducted by introducing 0.01 Torr of Ar gas. The substrate temperature was set within a range of from room temperature to 300° C. The sputtering power was 50 W under a standard condition, but was changed up to 400 W in a case of a high speed film-forming operation.

For the Comparative Examples, a ZnO target having no impurities incorporated and various targets having aluminum oxide ($Al_2O_3$), indium oxide ($In_2O_3$) and boron oxide ($B_2O_3$) incorporated in ZnO (the Al/Al+Zn ratio being 4 atomic %, the In/In+Zn ratio being 5 atomic %, and the B/B+Zn ratio being 4.5 atomic %) were prepared by a sintering method, and using such targets, samples of the Comparative Examples were prepared.

The Ga content in the prepared film was determined by dissolving the ZnO film in a 2N hydrochloric acid solution, followed by quantitative analysis by an ICP emission spectral analysis. The Ga content was represented by atomic % based on the total amount of gallium and zinc. The specific resistance was calculated from the sheet resistance obtained by a four probe method and the film thickness measured by a feeler film thickness meter.

Figure 2:
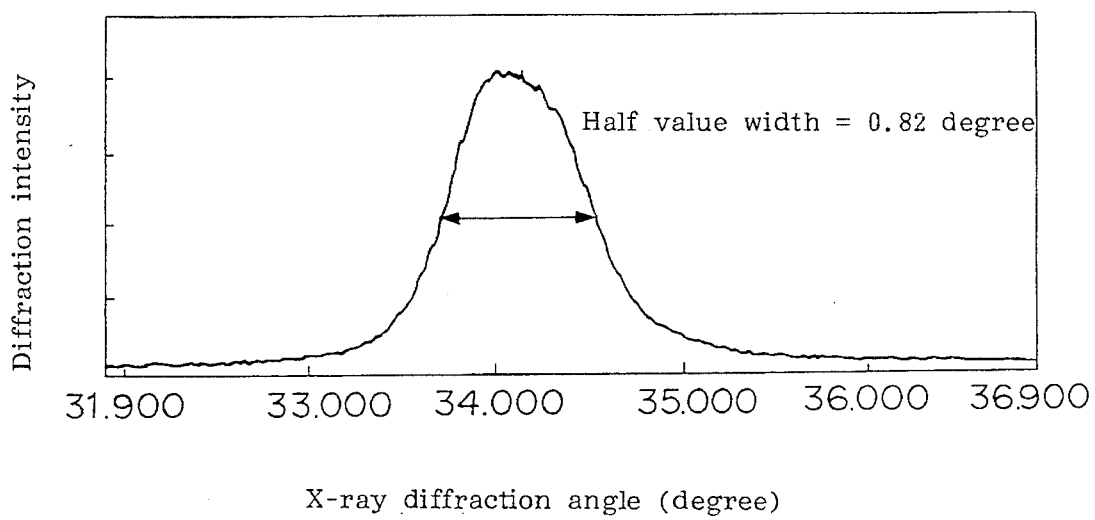
FIG. 2 is a graph showing the half value width of the X-ray diffraction peak of the (002) face of the transparent conductive film of Comparative Example 4.

The X-ray diffraction of the conductive film was measured by a rate meter using a proportional counter by means of $K\alpha$ ray of Cu. FIGS. 1 and 2 show cases wherein the X-ray diffraction was measured. These Figures show enlarged X-ray diffraction peaks of the (002) faces of the Ga-incorporated ZnO films of Example 3 and Comparative Example 4, as described hereinafter. As shown in each Figure, the width (represented by the degree) of the diffraction peak at ½ of the maximum intensity of the (002) peak is called a half value width. The half value width in the case of Example 3 in FIG. 1 is 0.28 degree, and the half value width in the case of Comparative Example 4 in FIG. 2 is 0.82 degree.

The visible light transmittance was measured by a spectroscope using an integrating sphere, and the transmittance was evaluated by an average value of the wavelengths of from 400 nm to 700 nm. With respect to these conductive films, heat treatment tests in the atmospheric air were conducted under the conditions as identified in Table 1. In Tables 2 and 3, the measured results are shown with respect to the property changes as between before and after the heat treatment.

TABLE 1

| Heat treatment temp (°C.) | Atmosphere | Treating time (min) |
|---|---|---|
| 500 | Atmospheric air | 10 |

Examples 1, 2, 3, 4, 5 and 6 shown in Table 2 represent the results of heat resistance tests with respect to films wherein the amounts of Ga incorporated are from 0.5 to 1.2 atomic %, and the half value widths of the (002) X-ray diffraction peaks are at most 0.6 degree. The half value width of the X-ray diffraction peak of the film of Example 3 was 0.28 degree as shown in FIG. 1. These films show high electric conductivity at a level of from $10^{-3}$ Ω·cm to $10^{-4}$ Ω·cm at the time of the film forming, and the electrical conductivity does not decrease and is equal or rather improved after the heat treatment in the atmospheric air at 500° C. for 10 minutes.

No change in the transmittance was observed, and thus they were round to be stable films against the heat treatment in the atmospheric air. Especially remarkable is the case of high speed film-forming shown in Example 4, wherein the film having a small half value width at a level of 0.45 degree even when formed at a high speed of 40 Å/sec., has a low resistance at a level of $2\times10^{-4}$ Ω·cm even immediately after the film formation, and it was also found to be stable even after the heat treatment in the atmospheric air.

TABLE 2

| Sample No. | Dopant element | Concentration of the dopant in the ZnO film (atomic %) | Half value width of the (002) X-ray peak (degree) | Film-forming speed (Å/sec) | Heat treatment test in the atmospheric air (500° C. for 10 min) | Resistivity ($\Omega$.cm) | Visible light transmittance (%) |
|---|---|---|---|---|---|---|---|
| Example 1 | Ga | 0.5 | 0.35 | 9 | Before | $4.5 \times 10^{-3}$ | 85 |
|  |  |  |  |  | After | $4.4 \times 10^{-3}$ | 85 |
| Example 2 | Ga | 2.5 | 0.42 | 20 | Before | $4.8 \times 10^{-4}$ | 85 |
|  |  |  |  |  | After | $4.5 \times 10^{-4}$ | 85 |
| Example 3 | Ga | 5 | 0.28 | 10 | Before | $2.4 \times 10^{-4}$ | 84 |
|  |  |  |  |  | After | $2.0 \times 10^{-4}$ | 84 |
| Example 4 | Ga | 5 | 0.45 | 40 | Before | $2.7 \times 10^{-4}$ | 83 |
|  |  |  |  |  | After | $2.5 \times 10^{-4}$ | 83 |
| Example 5 | Ga | 10 | 0.48 | 22 | Before | $7.8 \times 10^{-4}$ | 83 |
|  |  |  |  |  | After | $5.9 \times 10^{-4}$ | 83 |
| Example 6 | Ga | 12 | 0.55 | 11 | Before | $1.2 \times 10^{-3}$ | 83 |
|  |  |  |  |  | After | $9.7 \times 10^{-4}$ | 83 |

Whereas, Comparative Examples 1 and 2 in Table 3 represent cases wherein Ga was not incorporated, or Ga was incorporated but the amount was too small. Comparative Example 1 represents the case of non-incorporated ZnO, whereby no heat resistance was observed, as heretofore known. As shown in Comparative Example 2, when Ga was added in an amount of 0.3 atomic %, the half value width was good, but the heat resistance thereby obtained was practically totally inadequate.

Comparative Examples 3 and 4 represent cases wherein the amount of gallium incorporated was at least 0.5 atomic %, but the half value width was as large as at least 0.6. In such cases, the electric resistance after the film-formation was low, but the resistance increased substantially by the heat treatment in the atmospheric air. Comparative Example 5 represents a case where the amount of Ga incorporated was 15 atomic %, whereby the half value width was lower than 0.6, but the electrical resistance was found to increase by the heat treatment in the atmospheric air. With such a change in the resistance, the transmittance likewise changed (increased). This is believed to be attributable to the influence of the oxidation by the heat treatment in the atmospheric air.

Comparative Examples 6 to 9 represent cases wherein Al, In and B were incorporated as Group 3 elements other than Ga. In each case, the half value width was lower than 0.6, but no heat resistance in the atmospheric air was observed, and there was a substantial change in the transmittance. In Comparative Example 7 wherein Al was incorporated, it was attempted to conduct film formation at a high speed by increasing the sputtering power, but the resistance after the film formation was found to increase and the heat resistance was found to deteriorate as compared with the low speed film-formation as shown in Comparative Example 6. Thus, in the cases where Group 3 elements other than Ga were incorporated, no improvement in the heat resistance was observed even when the half value width of the X-ray diffraction was small.

TABLE 3

| Sample No. | Dopant element | Concentration of the dopant in the ZnO film (atomic %) | Half value width of the (002) X-ray peak (degree) | Film-forming speed (Å/sec) | Heat treatment test in the atmospheric air (500° C. for 10 min) | Resistivity ($\Omega$.cm) | Visible light transmittance (%) |
|---|---|---|---|---|---|---|---|
| Comparative Example 1 | — | 0 | 0.41 | 8 | Before | $4.6 \times 10^{-3}$ | 82 |
|  |  |  |  |  | After | $>1 \times 10^{1}$ | 84 |
| Comparative Example 2 | Ga | 0.3 | 0.49 | 10 | Before | $2.5 \times 10^{-3}$ | 83 |
|  |  |  |  |  | After | $7.3 \times 10^{-2}$ | 84 |
| Comparative Example 3 | Ga | 2.5 | 0.65 | 10 | Before | $5.7 \times 10^{-4}$ | 82 |
|  |  |  |  |  | After | $2.3 \times 10^{-3}$ | 83 |
| Comparative Example 4 | Ga | 5 | 0.82 | 10 | Before | $5.2 \times 10^{-4}$ | 82 |
|  |  |  |  |  | After | $3.0 \times 10^{-3}$ | 83 |
| Comparative Example 5 | Ga | 15 | 0.53 | 12 | Before | $2.1 \times 10^{-3}$ | 80 |
|  |  |  |  |  | After | $1.5 \times 10^{-2}$ | 82 |
| Comparative Example 6 | Al | 4 | 0.38 | 7 | Before | $5.8 \times 10^{-4}$ | 82 |
|  |  |  |  |  | After | $2.4 \times 10^{-2}$ | 84 |
| Comparative Example 7 | Al | 4 | 0.55 | 20 | Before | $3.7 \times 10^{-3}$ | 80 |
|  |  |  |  |  | After | $1.8 \times 10^{0}$ | 83 |
| Comparative Example 8 | In | 5 | 0.43 | 8 | Before | $1 \times 10^{-3}$ | 81 |
|  |  |  |  |  | After | $4 \times 10^{-1}$ | 83 |
| Comparative Example 9 | B | 4.5 | 0.47 | 8 | Before | $8 \times 10^{-4}$ | 80 |
|  |  |  |  |  | After | $6 \times 10^{-2}$ | 82 |

EXAMPLES 7 to 12 and COMPARATIVE EXAMPLES 10 to 13

High purity ZnO powder and $Ga_2O_3$ powder were prepared. The ZnO powder and the $Ga_2O_3$ powder were mixed by a ball mill to have compositions wherein Ga was 1.5 atomic %, 3.0 atomic % and 5.0 atomic %, to obtain three types of $Ga_2O_3$-ZnO powders. Then, each powder was molded by a rubber press method. Here, the pressing pressure was 4000 kg/cm². The molded product was sintered at a temperature of 1400° C. and 1500° C. in air to obtain a sintered product. A target having a size of 3 inches in diameter and 5 mm in thickness was cut from the sintered product. (FIG. 3 shows an X-ray diffraction pattern of the sintered product obtained by sintering a molded product of a ZnO powder having 5.0 atomic % of Ga incorporated in air at 1400° C.) Then, with respect to each target, film-formation of a $Ga_2O_3$-ZnO film was conducted by means of a magnetron sputtering apparatus. Here, the sputtering was conducted under such conditions that the applied power was DC50W, the pressure was $5 \times 10^{-3}$ Torr, and the substrate temperature was 200° C. As the substrate, a silica-coated glass was employed. The sputtering was conducted to have a film thickness of about 500 nm. After forming the film, the film thickness, the sheet resistance and the visible light transmittance were measured, and the specific resistance of the film was calculated from the film thickness and the sheet resistance.

Table 4 shows the X-ray intensity ratio $I_1/I_2$ of the (002) face of the target prepared as described above and the specific resistance and the visible light transmittance of the film after heat treatment for 10 minutes at 500° C. in air, which represent the specific resistance and the heat resistance in air after the film-formation of the film formed by using the target of the present invention.

the specific resistance of the films increased substantially by the heat treatment at 500° C. in air.

EXAMPLES 13 to 16 and COMPARATIVE EXAMPLES 14 to 17

High purity ZnO powder and $Ga_2O_3$ powder were prepared. The ZnO powder and the $Ga_2O_3$ powder were mixed in a ball mill to obtain $Ga_2O_3$-ZnO powders. Then, each powder was molded by a rubber press method. The molded product was sintered at 1400° C. in air to obtain a material for vapor deposition (FIG. 4 shows an X-ray diffraction pattern of a sintered product of ZnO having 5 atomic % of Ga incorporated and sintered at 1400° C. in air).

Then, film-forming of a GZO film was conducted by means of an electron beam (EB) vapor deposition apparatus with respect to each material for vapor deposition. Here, the substrate temperature was 200° C. As the substrate, a silica-coated glass was employed. The operation was conducted so that the film thickness would be about 500 nm. After forming the film, the film thickness, the sheet resistance and the visible light transmittance were measured, and the specific resistance of the film was calculated from the film thickness and the sheet resistance.

Table 5 shows the X-ray intensity ratio $I_1/I_2$ of the (002) face of the material for vapor deposition prepared as described above, the specific resistance of the film formed immediately after the initiation of the operation using the

TABLE 4

| | Characteristic of the target | | | Characteristic of the film | |
|---|---|---|---|---|---|
| | Amount of Ga incorporated (atomic %) | Sintering temp (°C.) | $I_1/I_2$ | Specific resistance after the film-formation ($10^{-4}$ Ω.cm) | Specific resistance after the heat treatment ($10^{-4}$ Ω.cm) |
| Example 7 | 1.5 | 1400 | 0.23 | 3.7 | 3.7 |
| Example 8 | 1.5 | 1500 | 0.35 | 3.7 | 3.6 |
| Example 9 | 3.0 | 1400 | 0.45 | 2.8 | 2.4 |
| Example 10 | 3.0 | 1500 | 0.60 | 2.9 | 2.5 |
| Example 11 | 5.0 | 1400 | 2.20 | 2.7 | 2.4 |
| Example 12 | 5.0 | 1500 | 3.10 | 2.6 | 2.3 |
| Comparative Example 10 | 5.0 | 1200 | 0.12 | 2.8 | 6.7 |
| Comparative Example 11 | 1.0 | 1500 | 0.10 | 3.8 | 9.5 |
| Comparative Example 12 | AZO (3 wt % $Al_2O_3$ - 97 wt % ZnO) | | | 3.5 | 70.1 |
| Comparative Example 13 | ITO (10 wt % $SnO_2$ - 90 wt % $In_2O_3$) | | | 2.0 | 6.0 |

From Table 4, it is evident that with the films formed by using the targets of the present invention, the specific resistance was equal or tended to decrease even when subjected to heat treatment at 500° C. in air. Even after the heat treatment, the specific resistance was at a low level of from 2 to $3 \times 10^{-4}$ Ω·cm. By using the targets of the present invention, it was possible to obtain films having high heat resistance even in an atmosphere containing oxygen, such as in air. Further, the films formed by using the targets of the present invention had a high transmittance at a level of 85% of a visible light with a wavelength of 550 nm.

Further, Table 4 also includes, as Comparative Examples, cases wherein conventional ITO (10 wt % $SnO_2$–90 wt % $In_2O_3$) and AZO (3 wt % $Al_2O_3$–97 wt % ZnO) targets prepared in the same manner, and a target of $Ga_2O_3$-ZnO wherein $I_1/I_2 < 0.2$ which is outside the scope of the present invention, were employed. From Table 4, it is evident that when the targets of ITO, AZO and $I_1/I_2 < 0.2$ were employed, material for vapor deposition of the present invention and the specific resistance of the film formed 30 minutes later.

As shown in Table 5, the specific resistance of the films formed by using the targets of the present invention was the same as the specific resistance of the film immediately after the initiation of the operation even after 30 minutes of the operation, and no change with time of the films was observed. Yet, the obtained thin films had low resistance at a level of $2 \times 10^{-4}$ Ω·cm. Namely, it has been found that by using the materials for vapor deposition of the present invention, it is possible to form a vapor deposited film having low resistance with little change with time during the film-forming operation. Further, Table 5 also shows the specific resistance of the films after the formed films were heat-treated at 500° C. for 10 minutes in air.

As shown in Table 5, with the films formed by using the materials for vapor deposition of the present invention, the specific resistance was equal or even tended to decrease by the heat treatment at 500° C. in air, and even after the heat treatment, the specific resistance was as low as from 2 to $3\times10^{-4}$ Ω·cm. Namely, it has been found that the films formed by using the materials for vapor deposition of the present invention have high heat resistance even in air.

Further, the films formed by using the materials for vapor deposition of the present invention had high transmittance at a level of 85% of a visible light with a wavelength of 500 nm.

Table 5 also show, as Comparative Examples 14 and 15, cases wherein Ga-doped ZnO type materials for vapor deposition where $I_1/I_2<0.2$, were used, and, as Comparative Examples 16 and 17, cases wherein a conventional ITO type (5 atomic % Sn-doped $In_2O_3$) material for vapor deposition prepared in the same manner was used, and a conventional AZO type (2.5 atomic % Al-doped ZnO) material for vapor deposition prepared in the same manner, was used.

As shown in Table 5, in the cases where the materials for vapor deposition wherein $I_1/I_2<0.2$ and the conventional ITO type and AZO type materials for vapor deposition were used, the specific resistance of the films changed with time and substantially increased. Further, by the heat treatment at 500° C. for 10 minutes in air, the specific resistance of such films substantially increased.

or more.

Further, as shown by Comparative Example 5, with a film having a Ga concentration of 12 atomic % or higher, a substantial increase in the resistance is likewise observed after the heat treatment. Comparative Examples 6 to 9 show cases wherein the additive is a Group 3 element other than Ga, but in each case, no heat resistance in the atmospheric air is observed even though the half value width is less than 0.6.

As described in the foregoing, by controlling the Ga concentration and the half value width of the X-ray diffraction peak within certain specific ranges, it is possible to realize transparent conductive films having high electrical conductivity and transmittance, and it is further possible to obtain oxidation-resistant transparent conductive films whereby the electrical conductivity will not be impaired even by the heat treatment in the atmospheric air. Accordingly, such films are provided with various desired properties such as high transparency, low electrical resistance, high heat resistance in the atmospheric air and low costs, and they are most useful as transparent electrodes for various display devices, solar cells and light receptor elements, as heat ray reflecting films, selective permeation films and electromagnetic wave-shielding films for buildings and automobiles, as transparent heater elements for anti-fogging or anti-icing of

TABLE 5

| | Characteristic of the material for vapor deposition | | | Specific resistance of the film ($10^{-4}$ Ω.cm) | | | |
|---|---|---|---|---|---|---|---|
| | | | | Change with time | | Change by heat treatment | |
| | Amount of Ga incorporated (atomic %) | Sintering temp (°C.) | $I_1/I_2$ | Immediately after the film-forming operation | 30 min. later | Immediately after film formation | After heat treatment |
| Example 13 | 1.5 | 1400 | 0.23 | 2.7 | 2.7 | 2.7 | 2.7 |
| Example 14 | 3.0 | 1400 | 0.45 | 2.4 | 2.4 | 2.4 | 2.4 |
| Example 15 | 5.0 | 1400 | 2.20 | 2.2 | 2.2 | 2.2 | 2.0 |
| Example 16 | 7.0 | 1400 | 5.20 | 2.6 | 2.6 | 2.6 | 2.3 |
| Comparative Example 14 | 5.0 | 1200 | 0.12 | 2.4 | 3.6 | 2.4 | 6.8 |
| Comparative Example 15 | 1.0 | 1400 | 0.10 | 2.7 | 5.3 | 2.7 | 9.5 |
| Comparative Example 16 | ITO (5 atomic % Sn—$In_2O_3$) | | | 2.0 | 5.0 | 2.0 | 5.5 |
| Comparative Example 17 | AZO (2.5 atomic % Al—Zno) | | | 4.5 | 10.5 | 4.5 | 70.5 |

As is apparent from Table 2, films wherein the Ga concentration is from 0.5 to 12 atomic % show high electrical conductivity at a level of from $10^{-3}$ to $10^{-4}$ Ω·cm during the film-forming operation, and the electrical conductivity does not decrease and is equal or even improved after the heat treatment in the atmospheric air. No change in the transmittance is observed, indicating that they are films stable in a high temperature atmospheric air.

Whereas, as shown in Comparative Examples 1 and 2 in Table 3, with films having a Ga content of less than 0.5 atomic %, even when the half value width of the X-ray diffraction peak is less than 0.6, a substantial increase in the resistance is observed after the heat treatment in the atmospheric air. At the same time, the transmittance changes by the heat treatment. Further, as shown in Comparative Examples 3 and 4, even if the Ga content is 5 atomic %, an increase in the resistance by the heat treatment in the atmospheric air is observed when the half value width is 0.6 automobiles, freezer show cases or other buildings, or as antistatic films for photomasks or buildings. Thus, they are applicable to a wide range of technical fields.

Further, by using the target of the present invention, a transparent conductive film having high heat resistance can be obtained even in an atmosphere containing oxygen such as in air. Furthermore, the target of the present invention is substantially free from blackening (a phenomenon in which the amount of oxygen at the surface of the target decreases by sputtering, whereby the target surface blackens) during the use, since in the target, gallium is present in the form of a Ga solid-solubilized ZnO phase. Thus, no substantial change with time, such as no substantial increase in the specific resistance of the film, is observed even when used for a long period of time.

Further, by using the material for vacuum deposition of the present invention, it is possible to obtain a low resistance transparent conductive film having high heat resistance even in air, without any substantial change with time in the film composition or in the material for vapor deposition during the vapor deposition.

We claim:

1. A transparent conductive film comprising zinc oxide and gallium, wherein gallium is present in an amount from 0.5 to 12 atomic % based on the total amount of gallium and zinc, and which has a diffraction peak of the (002) face in its X-ray diffraction pattern, wherein the half-width of the diffraction peak of the (002) face is at most 0.6 degrees.

* * * * *